United States Patent [19]

Yamada

[11] Patent Number: 4,509,203

[45] Date of Patent: Apr. 2, 1985

[54] AUTO TUNING RECEIVER WITH A TUNING INFORMATION MEMORY

[75] Inventor: Shinji Yamada, Higashihiroshima, Japan

[73] Assignee: Sharp Kabushiki Kaisha, Osaka, Japan

[21] Appl. No.: 391,385

[22] Filed: Jun. 23, 1982

[30] Foreign Application Priority Data

Jun. 24, 1981 [JP] Japan ................................ 56-98720

[51] Int. Cl.³ ............................................. H03J 7/18
[52] U.S. Cl. ................................ 455/166; 455/165; 455/184; 455/186
[58] Field of Search .................. 455/32, 62, 161, 164, 455/165, 166, 169, 184, 185, 186, 179

[56] References Cited

U.S. PATENT DOCUMENTS

| | | | |
|---|---|---|---|
| 3,983,492 | 9/1976 | Fisher et al. | 455/179 |
| 4,285,066 | 8/1981 | Van Deursen | 455/185 |
| 4,355,414 | 10/1982 | Inoue | 455/184 |
| 4,387,469 | 6/1983 | Miyazaki et al. | 455/161 |

FOREIGN PATENT DOCUMENTS

| | | | |
|---|---|---|---|
| 54147711 | 11/1979 | Japan | 455/184 |
| 5552627 | 4/1980 | Japan | 455/185 |
| 5732140 | 2/1982 | Japan | 455/184 |

*Primary Examiner*—Jin F. Ng
*Attorney, Agent, or Firm*—Birch, Stewart, Kolasch & Birch

[57] ABSTRACT

An auto tuning/storing receiver includes a PLL frequency synthesizer for scanning of frequency. The receiver is provided with means storing field intensity signals characteristic of the intensities of broadcasts at the same time as tuning signals characteristics of tuning frequencies are stored. Once the storing means has been full of the tuning signals during the scanning of frequencies, comparison is effected in field intensity between a new broadcast and all of the already stored broadcasts whenever the field intensity of the new one exceeds the reference or the storing criterion. Should the field intensity of the new one be higher than the lowest field intensity of one of the already stored broadcasts, the new broadcast (both its related tuning signal and field intensity signal) replaces the most feeble of the previous broadcasts automatically. An alternative way is to remove the tuning signal and field intensity signal concerning the latter broadcast (most feeble) and access and shift on one-by-one basis for storage of the information which follows regarding the next succeeding or remaining broadcasts when the former (new) broadcast is higher in field intensity than the latter broadcast.

13 Claims, 6 Drawing Figures

| ADDRESS | "1" | "2" | "3" | "4" | "5" |
|---|---|---|---|---|---|
| Frequency | 76.3 | 77.8 | 78.3 | 79.2 | 80.2 |
| Field Strength | 4 | 3 | 1 | 2 | 3 |

AUTO TUNING RECEIVER WITH A TUNING INFORMATION MEMORY

BACKGROUND OF THE INVENTION

This invention relates to an auto tuning/storing receiver using a phase lock loop frequency synthesizer.

A receiver using a PLL frequency synthesizer is generally designed such that the division ratio of the PLL circuit is varied through a scan circuit and the scanning of tuning frequency by the scan circuit is discontinued in response to the output of an IF amplifier or a detector to thereby enable auto tuning. An improvement in the above-mentioned type of radio receiver has already been proposed which includes a memory circuit for storing division ratios of the receiving frequencies or an information characteristic of such division ratios (referred to as tuning signals hereinafter), i.e. radio receivers capable of storing receivable frequencies. See, for example, Japanese Patent Kokoku No. 52/32805. This sort of receivers however requires that the listener push a switch or the like to place the instantaneous receiving frequency into a memory circuit whenever the receiver receives a properly broadcast signal of a certain station and stops a scanning of the receiving frequency.

A further improved receiver has be devised which eliminates the listener's manual operation and in particular loads the instantaneous receiving frequency into the memory circuit automatically each time it achieves auto tuning through scanning and restarts the scanning of the receiving frequency after the loading of such a receivable frequency (this is referred to as an "auto tuning/storing receiver"). This receiver design offers significant advantages especially in automobile receivers, that is a minimum of required listener's interactions and a maximum of driving safety.

The capacity of the memory circuit or the number of tuning frequencies to be stored therein is inevitably limited so that criteria shall be established as to whether the instantaneous tuning frequency is to be stored in the memory circuit. The problem is where the reference level shall be set as to the field intensity of a monitoring broadcast. In other words, when provided that the reference level of field intensity (this is referred to as "storing criterion" hereinafter) is selected low, the receiver exhibits high sensitivity for almost all of the broadcasts and therefore presents the problem that the memory circuit becomes filled with only receivable frequencies in a low frequency range shortly after the scanning of frequency has been started. On the other hand, if the reference level is too high, then the broadcasts which are allowed to be stored in the memory circuit are limited to those having very high field intensities and the memory circuit is not used fully and effectively when this occurs.

A possible resolution to circumvent the problems discussed above is to manually re-adjust the storing criterion and repeat a sequence of auto tuning/storing. With automobile receivers, the manual operations required should be reduced as much as possible because of the needs of safe driving. The same applies to other radio receivers.

OBJECT AND SUMMARY OF THE INVENTION

Accordingly, it is an object of the present invention to provide a receiver which overcomes the above problems or disadvantages through provision of means for storing not only tuning or receivable frequencies but also information characteristic of the field intensities of the corresponding broadcasts (this is referred to as "field intensity signal" hereinafter).

In carrying out the present invention, the storing criterion as mentioned is established at a lowest level that assures a highest sensitivity. Means is provided for storing the field intensity signals characteristic of the intensities of the broadcasts at the same time as the tuning signals are stored. Once the storing means has been full of the tuning signals during the scanning of frequencies, comparison is effected in field intensity between a new broadcast and all of the already stored broadcasts whenever the field intensity of the new one exceeds the reference or the storing criterion. Should the field intensity of the new frequency be higher than the lowest field intensity of one of the already stored broadcasts, the new broadcast (both its related tuning signal and field intensity signal) replaces the most feeble of the previous broadcasts automatically. This is called the first method. An alternative way is to remove the tuning signal and field intensity signal concerning the latter broadcast (most feeble) and access and shift on one-by-one basis for storage the information which follows as regards the next succeeding or remaining broadcasts when the former (new) broadcast is higher in field intensity than the latter boardcast. This is called second method.

Using either of the two methods all the steps for tuning and storing are repeated until the scanning of frequency is completed. This invention offers a highly efficient and easy-to-use receiver which is able to load in full capacity into a memory circuit broadcasts whose field intensity are above the predetermined level.

In a preferred form of the present invention, there is provided a receiver of the type wherein a PLL frequency synthesizer is employed to scan broadcast frequencies and frequency information characteristic of frequencies tuned to broadcasters is sequentially loaded therein during the scanning of frequencies and a desired one of the broadcasts is made receivable by presetting the frequency information so stored, said receiver comprising means for storing information characteristic of the intensity of a broadcast as well as its associated frequency information, means for comparing the field intensity information of a newly tuned broadcast with that of the broadcasts already stored in said storing means, and means responsive to the output of said comparing means for replacing the frequency information and field intensity information of the already stored broadcasts with that of the newly tuned broadcast.

BRIEF DESCRIPTION OF THE DRAWINGS

For a more complete understanding of the present invention and for further objects and advantages thereof, reference is now made to the following description taken in conjunction with the accompanying drawings, in which.

DETAILED DESCRIPTION OF THE INVENTION

Figure 1:
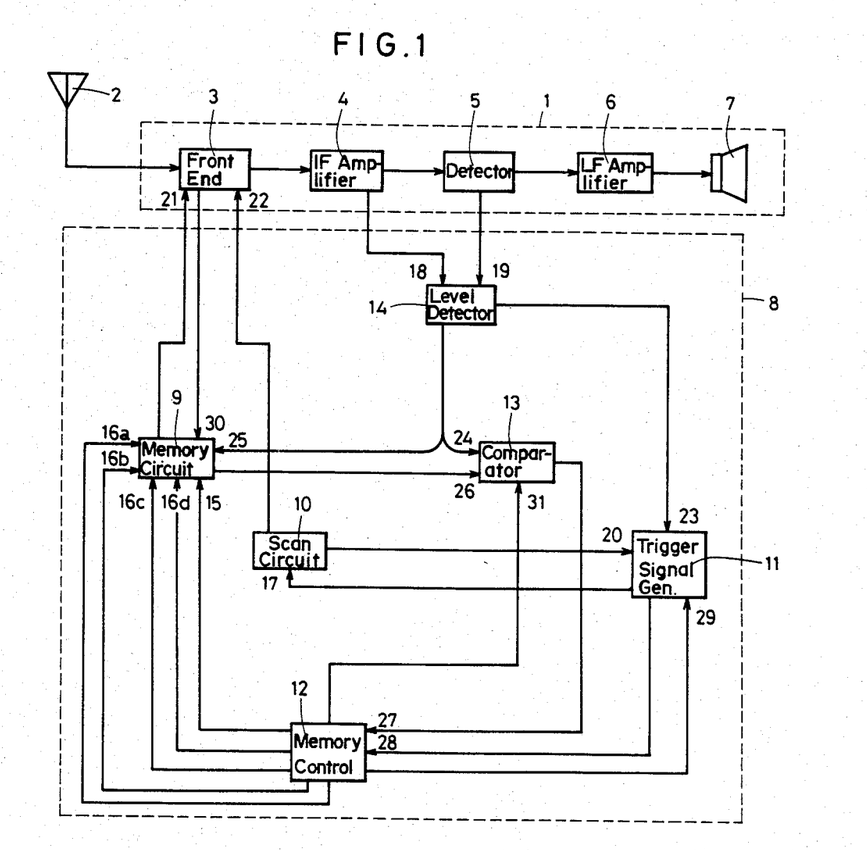
FIG. 1 is a schematic diagram of a radio receiver according to an embodiment of the present invention.

Referring now to FIG. 1, there is illustrated a receiver having a well known portion 1 as defined by the broken line. A front end 3 includes a PLL frequency synthesizer. When being received by an antenna 2, a broadcast is selected by the front end 3 and converted into an IF frequency and then amplified via an IF amplifier 4. An audio signal is sensed by a detector 5, amplified by an LF amplifier 6 and released via a loudspeaker 7.

A circuit portion as defined by reference number 8 includes circuits 10, 11 and 14 for execution of auto tuning and circuits 9, 12 and 13 for execution of information storing. The memory circuit 9 is designed to store the tuning signals, i.e. information characteristic of the frequency and field intensity of a certain broadcast received and tuned. Operation of the memory circuit 9 is governed by signals 15 and 16a to 16d from a memory control 12.

The scan circuit 10 is designed to scan the tuning signals to be fed to the front end for auto tuning. Operation of the scan circuit 10 is responsive to a trigger signal 17 from the trigger signal generator 11 and furnishes a scan end signal 20 to the trigger signal generator 11 to thereby discontinue application of the trigger signal 17 from the trigger signal generator 11 when scanning is completed throughout a full range of frequency.

The front end is supplied selectively with the tuning signal 21 fed from the memory circuit 9 to the front end 3 or the tuning signal 22 from the scan circuit 10, when one of already stored receiving frequencies is preset and selected for auto tuning or when in scanning.

The level detector 14 is designed to develop a scan interrupt signal 23 and a field intensity signal 24 or 25, with the former originating from a detection output 18 from the IF amplifier 4 or a detection output 19 from the detector 5 or both thereof when a broadcast is received and the latter representing in a digital fashion the field intensity of the received broadcast.

When tuning and receiving of any AM broadcast is desired, either of the detection signals 18 and 19 fed to the level detector 14 are dispensable and the scan interrupt signal 23 and the field intensity signals 24 and 25 are produced depending upon the detection signal which varies according to the field intensity of the received AM broadcast. In the case of FM reception, both of the detection signals 18 and 19 are necessary for production of the scan interrupt signal 23 and the field intensity signal. The detection signal 18 is produced in a manner similar to AM reception and the remaining detection signal 19 is produced using an "S"-curve signal indicative of the center of a frequency range. The field intensity signals 24 and 25 may be produced easily through the use of an analog-to-digital converter, a priority encoder, etc. The comparator 13 is designed to compare the field intensity signal being developed from the level detector 14 with the field intensity signal 26 of a certain broadcast as already stored in the memory circuit 9 in response to a comparison instruction 31 from the memory control 12 discussed hereafter. In the event that the memory circuit 9 is fully occupied in the course of frequency scanning, comparison is carried out between a new broadcast sensed in the succeeding step of frequency scanning and one of the already stored broadcasts whose field intensity is the lowest. If the former is stronger than the latter, then the memory control 12 is given an exchange instruction 27.

The trigger signal generator 11 generates various signals for execution of scanning by the scan circuit 10 during auto tuning and especially discontinues generation of the trigger signal 17 and feeds a control signal 28 to the memory control 12 when a certain broadcast is received and the scan interrupt signal 23 is applied thereto. The generator 11 generates again the trigger signal 17 in response to a signal 29 from the memory control 12.

In response to the control signal 28 from the trigger signal generator 11 during the auto tuning mode, the memory control 12 furnishes an address signal 15 and a write enabling signal 16 to the memory circuit 9, thus permitting the memory circuit 9 to store a tuning signal 30 from the front end 3 (i.e. the tuning signal 22 when scanning is discontinued) and the field intensity signal 25 from the level detector 14. Once the memory circuit has been occupied during the course of auto tuning and storing process, the memory control 12 issues the comparison instruction 31 in response to the control signal 28 from the circuit 11 to render the comparator 13 operable and at the same time issues the address signal 15 and a read enabling signal 16b to the memory circuit 9. As a result, the field intensity signal 26 is read out of the memory circuit 9 and fed to the comparator 13. It should be noticed that the control circuit 12 provides other signals such as a clear signal 16c and a shift signal 16d as explained in detail later.

The embodiment of the present invention is implemented as seen in the block diagram and the following will set forth a sequence of operation executed by the illustrated embodiment which relies upon the second method as defined hereinbefore.

When a switch (not shown) is switched on to start the auto tuning and storing process, the trigger signal 17 is fed from the trigger signal generator 11 to the scan circuit 10, thus starting frequency scanning with a particular frequency. It should be noted that the storing criterion as to whether to develop the scan interrupt signal 23 is set at a considerably low level in the level detector 14 so that the receiver may exhibit a high sensitivity in tuning the broadcasts. When a broadcast with a field intensity exceeding the storing criterion is received, the level detector 14 provides the scan stop signal for the trigger signal generator 11 to discontinue the generation of the trigger signal 17. The scan circuit 10 therefore stops scanning the tuning signals. At the same time the control signal 28 is fed to the memory control 12 which in turn supplies the address signal 15 and the write enabling signal 16a to the memory circuit 9, permitting the memory circuit 9 to store (or write) information.

Figure 2:
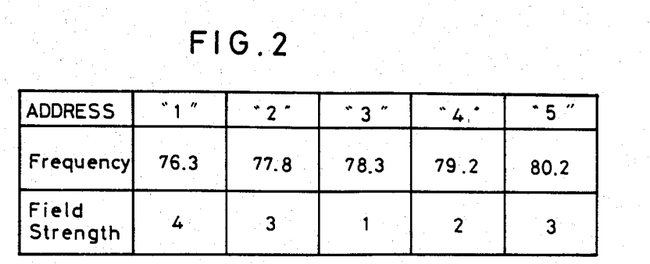
FIG. 2 is an illustration of the contents of a memory circuit in FIG. 1.

As soon as the write enabling signal 16a is received, the memory circuit 9 accepts the tuning signal 30 characteristic of the frequency of the received broadcast as supplied from the front end 3 and the field intensity signal 25 characteristic of the field intensity of the received broadcast as supplied from the level detector 14 and holds the same at addresses as specified by the address signal 15. If the memory circuit 9 has a capacity extending from address "1" to address "5" and a broadcast with a frequency 76.3 MHz and a field intensity of "4" is to be loaded into address "1", the frequency and field intensity are stored into the memory circuit at address "1" as seen in FIG. 2. When the storing of this broadcast is completed, the memory control 12 provides the trigger signal generator 11 with a signal 29 indicative of the end of the storing operation so that the trigger signal again generator 11 generates the trigger signal 17 to restart the scanning of tuning signals by the scan circuit 10. The above operational procedure is repeated whenever a broadcast whose field intensity goes over the storing criterion is received and the scan interrupt signal 23 is generated. Receivable broadcasts are therefore loaded in full capacity (address) of the memory circuit 9. Once the memory circuit 9 is fully loaded with the receivable broadcasts in the course of auto tuning/storing, the level detector 14 supplies the scan interrurpt signal 23 (i.e. there is received a broadcast having an intensity higher than the storing criterion) and the memory control 12 supplies the comparison instruction 31 to the comparator 13. The memory circuit 9 receives the address signal 15 and the read enabling signal 16b. The comparator 13 then compares the field intensity of the newly received broadcast with that of the broadcasts already stored in the memory circuit 13.

Assume now that five broadcasts whose frequencies and field intensities are shown in FIG. 2 have been loaded during auto tuning/storing. After the 80.2 MHz broadcast has been tuned and stored automatically, the memory control 12 supplies the read enabling signal 16b and the address signal 33 to the memory circuit 9 and the comparison instruction 31 to the comparator 13 whenever the level detector 14 detects a broadcast having a more than criterion field intensity and provides the scan interrupt signal 23. For example, if a broadcast of a frequency of 80.8 MHz and a field intensity of "2" which follows the 80.2 MHz broadcast is automatically tuned, the memory control 12 responds to the control signal 28 from the trigger control generator 11 to develop the signal specifying address "1" and then the memory circuit 9 sends to the comparator 13 the field intensity signal 26 of the broadcast loaded at address "1". The comparator 13 compares the level of the field intensity signal 26 (that is, "4") and that of the newly tuned broadcast (that is, "2") and decides that the 80.8 MHz is less intensive than the counterpart, with no development of the exchange instruction 27.

The memory control 12 makes sure if there is no exchange instruction 27 from the comparator 13, immediately after it has supplied the address signal 15 specifying address "1". In this instance, the memory control 12 supplies the memory circuit 9 with the address signal 15 specifying address "2" because of the absence of the exchange instruction 27.

The memory control 12 governs operation of the memory circuit 9 and the comparator 13 in such a manner as to compare the field intensity signals at the respective address of the memory circuit 9 with the field intensity of the broadcast being currently tuned.

If the 78.3 MHz broadcast with a field intensity of "1" as stored at address "3" of the memory circuit 9 is subject to comparison, the field intensity "2" of the 80.8 MHz broadcast currently tuned is higher so that the comparator 13 supplies the exchange instruction 27 to the memory control 12.

The memory control 12 recognizes the exchange instruction 27 has been given, suppling the clear signal 16c and the "3" address signal 15 to the memory circuit 9 to clear the the field intensity signal "1" from address "3" of the memory circuit 9. Upon subsequent receipt of the shift signal 16d the signals at address "4" is shifted to address "3" and those at address "5" to address "4" and the field intensity "2" of the newly tuned 80.8 MHz broadcast is placed into address "5" of the memory circuit 9. The memory control 12 sends the storing completion signal 29 to the trigger signal generator 11 which in turn re-starts the generation of the trigger signal 17, permitting the scan circuit 10 to scan higher frequencies.

The auto tuning and storing procedure is executed throughout a full range of frequencies even after the memory circuit 9 has been fully occupied. After the scanning of frequency has been carried out over its full range, the scan circuit 10 supplies the scan end signal 20 to the trigger signal generator 11, thus discontinuing the generation of the trigger signal 17 and ending the auto storing and storing procedure.

Advantageously, the above arrangement in which the most feeble broadcast (78.3 MHz at address "3" in the above example) is exchanged with the newly tuned but more intensive broadcast (80.8 MHz), permits the most effective utilization of the memory circuit of a limited capacity and the best reception of broadcasts stored beginning with the most intensive one.

Figure 3:
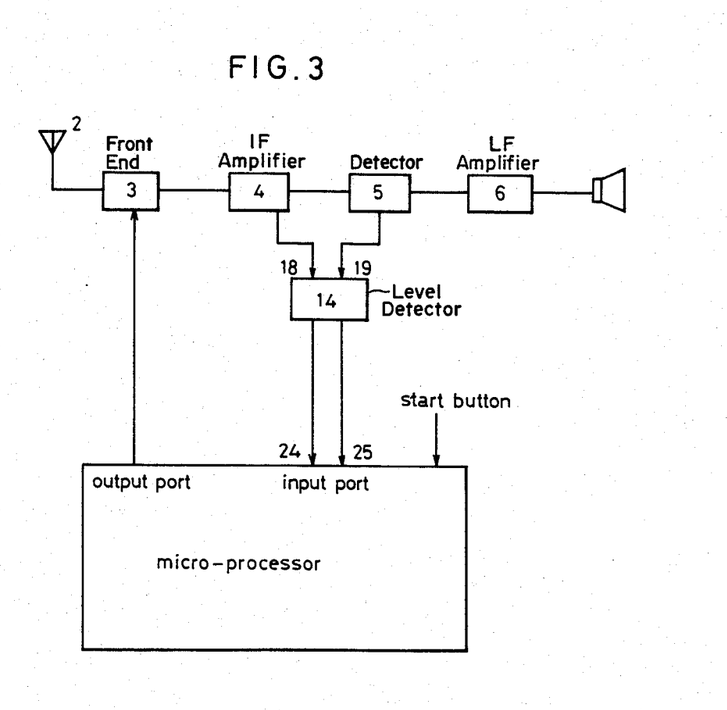
FIG. 3 is a block diagram of another embodiment of the present invention.
Figure 4:
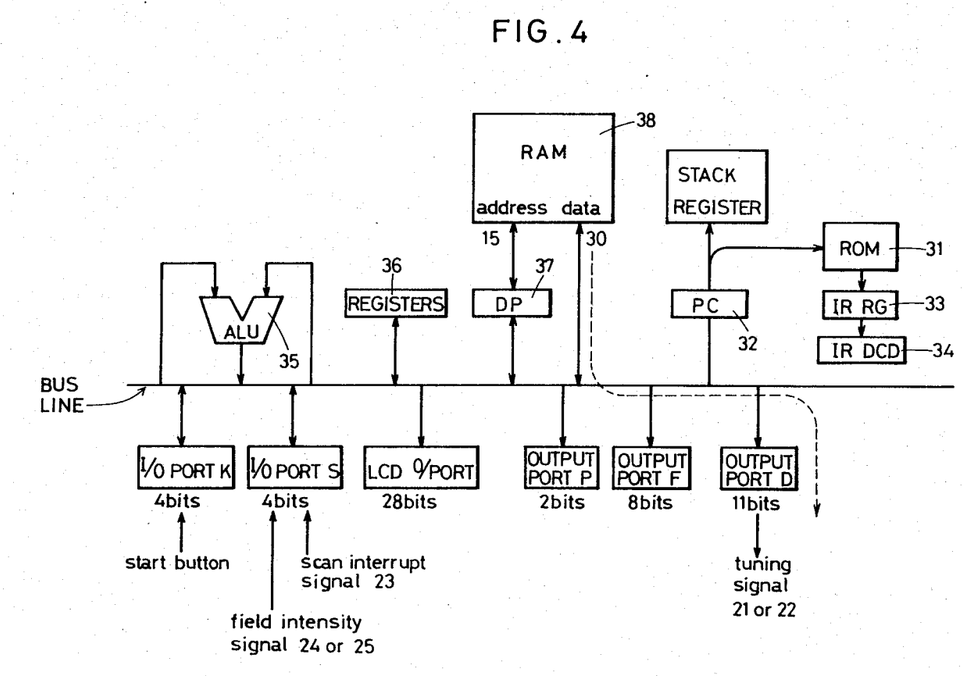
FIG. 4 is a detailed block diagram of the embodiment of FIG. 3.
Figure 5A:
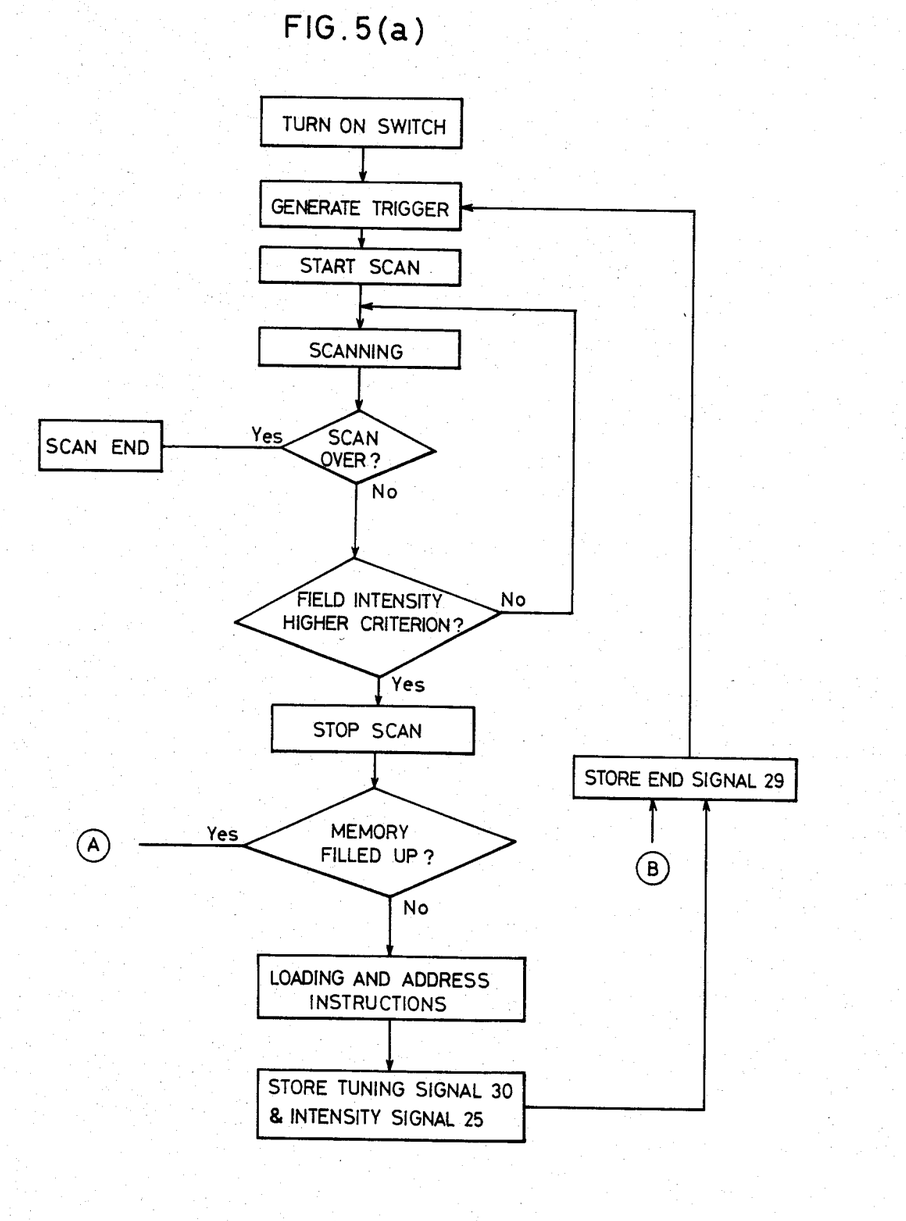
FIGS. 5(a) and 5(b) are flow charts for explanation of operation of the embodiment of FIG. 3.
Figure 5B:
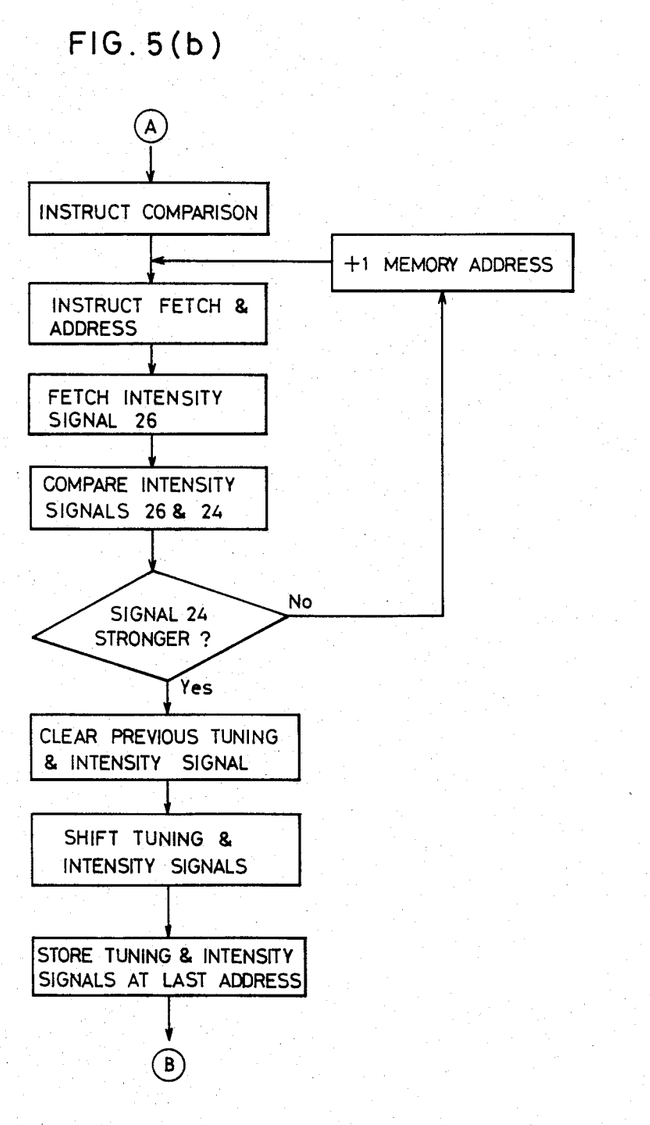

FIGS. 3 and 4 shows another embodiment of the present invention which is implemented with well-established microcomputer technology. That is, the above described performance is achieved using a microcomputer 31, for example, M58497 by Mitsubishi Electric, which microcomputer receives and supplies signals via input and output ports. For example, "4 bits" represents four lines used for receiving and supplying the signals. Details of the microcomputer 31 are illustrated in FIG. 4 and a flow chart thereof is illustrated in FIGS. 5(a) and 5(b).

A read only memory (ROM) 31 is a memory for storing in a digital fashion instructions for execution of the auto tuning storing procedure and other operations necessary for the microcomputer. A program counter (PC) 32 stores as data addresses specifying individual portions of ROM 31 and generally serves as a counter. A particular instruction stored at a particular location of ROM as specified by the count of the program counter PC is unloaded into an instruction register (IR register) 33 and then to an instruction decoder (IR decoder) 34 for decoding of that instruction. In response to the contents of the instruction thus decoded, proper connections are established among the various components in the microcomputer 31 in order to execute that instruction. The program counter is then incremental by one and the nexe succeeding instruction is fetched and transferred in the same manner. A series of those instructions or a program is execured through repetition of the above procedure.

The scan circuit 10 varies the receiving frequency in a certain direction (descending order or ascending order) at a fixed interval and typically increments the tuning signal or the division ratio of the PLL frequency synthesizer by a prefixed value in the case of the frequency ascending order.

For example,

PLL standard frequency $f_r = 25$ KHz local oscillation frequency $f_{osc}$ to be developed by PLL (when 76.00 MHz is received) is: $f_{osc} = 76.000 - 10.700 = 65.300$ MHz (in case of lower heterodyne)

division ratio $N = 65300/25 = 2612$

When it is desired to increase frequency at an interval of 100 KHz, that is, when 76.100 MHz is to be received, $f_{osc} = 76.100 - 10.700 = 65.400$ MHz division ratio $N_1 = 65400/25 = 2616$ In conclusion, the division ratio shall be incremented by 4.

Operation of the scan circuit 10 is implemented with an arithmetic logic unit (ALU) 35, a family of registers 36 and output ports 37 (port D in the given example). When it is desired to start the auto tuning and storing procedure with a particular frequency, the division ratio of frequency is written with the desired data form into a random access memory (RAM) 38 and ROM 31. The tuning signal 22 is fed from the output port D to the front end 3. If scanning proceeds to a next frequency after execution of operations necessary for reception at that previous frequency and level detection by the detector 14, the division ratio is supplied to an input to ALU 35 and the value "4" as calculated above to another input to ALU so that ALU performs addition thereon. A new division resulting from such addition is loaded into one of the registers 36 and the tuning signal 22 is transferred from output port D to the front end 3. Thereafter, the already loaded division ratio is recalled again and supplied to one input of the ALU while "4" is supplied to the other input to ALU. The scanning of frequency is carried out through repeated execution of the above procedure.

While a particular frequency is received during the course of scanning, the signal 23 from the level detector 14 is received via input port S (port S of M58497 is useful as not only an input port but also an output port), ALU 35 decides whether frequency scanning is to be interrupted. If scanning is to be interrupted, the next succeeding addition of "4" is stopped. If a level at a signal line connected to input port S is at a high level, for example, it indicates that the storing criterion is not reached. On the other hand, if it is at a low level, the storing criterion is exceeded and the scan interrupt signal 23 is therefore generated.

When the signal 23 is received, i.e. when the ALU decides from the signal entered via port S that there is a broadcast satisfying the storing criterion, the instantaneous ratio of frequency division is transferred from the one of the registers to RAM.

A data pointer (DP) 37 is designed to specify the particular location of RAM 38. The signal transferred from DP to RAM is the address signal 15 in FIG. 1.

RAM 38 is a store for containing various kinds of data and is the equivalent of the memory circuit 9 in FIG. 1. The tuning signal 21 for use in recalling the previously stored receivable frequencies is the frequency division ratio contained in the location of RAM 38 as specified by DP 37 and fed from RAM 38 to the front end 3 via output port D.

While the foregoing control signals (including the various signals 20, 27, 29, 16d, 16c, 16a, 16b, 17, etc.) are used for convenience of explanation only, those signals are processed through execution of a program.

For example, when the ratio of frequency division appearing at the moment of scanning interrupted is to be stored in the memory circuit 25 (FIG. 1), the signal 28 is sent to the memory control 12 and the signals 15 and 16a are fed to the memory circuit 9 in order to load the signals 30 and 25. Those steps of operation are executed in the microcomputer 31 as follows. The ALU 35 receives the signal 23 and decides by logic or other methods whether it is at a low level. Provided that frequency scanning is to be interrupted, the program counter 32 specifies the location where a program is stored for execution of the storing routine. One or more program instructions stored in that location of ROM 31 instructs the signal 15 to be conveyed from DP 37 to RAM 38 so that the ratio of frequency division for the broadcast being currently received is unloaded from the one of the registers 36 to RAM 38 (this implies supply of the tuning signal 30 to the memory circuit 9 in FIG. 1). The signal 25 is also stored in RAM 38 by way of port S. It should be noticed that the trigger signal 17 in FIG. 1 is an instruction for addition of the ratio of frequency division. In addition, the scan interrupt signal 20 is the signal which stops such addition when the ratio of frequency division stored in the one of the registers 36 equals that for the frequency where scanning is to be interrupted.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A radio receiver system comprising:
   receiver means for receiving and demodulating radio waves at an input frequency in response to a tuning signal to produce an output;
   detector means responsive to said receiver means for detecting the quality of said output and developing a current digital quality level signal indicative of the quality of said output;
   scanning means for providing said tuning signal to tune said receiver means to an input frequency within a desired range of frequencies;
   memory means having a plurality of memory sections for storing a plurality of signals within said range of frequencies and their corresponding digital quality level signals in response to said scanning means;
   means for comparing the current digital quality level signal with a stored digital level signal representing the weakest digital quality level; and for substituting the current digital quality level signal and its associated signal frequency for the level signal representing said weakest digital quality level and its associated frequency stored in said memory means when said current digital quality level signal exceeds the level of the quality signal representing said weakest digital level stored in said memory.

2. The system of claim 1 wherein said quality detected by said detector means is the intensity of said detected signal.

3. The system of claim 2 wherein said receiver means may receive and demodulate AM or FM radio broadcasts.

4. The system of claim 2 wherein said receiver means includes frequency synthesizer means for receiving said tuning signal.

5. A radio receiver system comprising:
   receiver means for receiving and demodulating radio waves at an input frequency in response to a tuning signal to produce an output;
   detector means responsive to said receiver means for detecting the quality of said output and developing a current digital quality level signal indicative of the quality of said output;

scanning means for providing said tuning signal to tune said receiver means to an input frequency within a desired range of frequencies;

memory means having a plurality or memory sections for storing a plurality of signals within said range of frequencies and their corresponding digital quality level signals in response to said scanning means;

comparator means for comparing said current digital quality level signal produced by said detector means to each said digital quality level signal stored in said memory means and for developing a substitution signal when said current digital quality level signal exceeds a stored quality level signal representing the weakest digital quality level; and control means for substituting the current digital quality level signal and its associated signal frequency for the quality level signal representing the weakest digital quality level and associated frequency stored therein upon detection of said substitution signal produced by said comparator means.

6. The system of claim 5 wherein said quality is the intensity of said detected signal.

7. The system of claim 6 wherein said receiver means may receive and demodulate AM or FM radio broadcasts.

8. The system of claim 6 wherein said receiver means includes frequency synthesizer means for receiving said tuning signal.

9. A radio receiver system comprising:

receiver means for receiving and demodulating radio waves at an input frequency in response to a tuning signal to produce an output;

detector means responsive to said receiver means for detecting the quality of said output and developing a current digital quality level signal indicative of the quality of said output;

scanning means for providing said tuning signal to tune said receiver means to an input frequency within a desired range of frequencies;

memory means having a plurality of memory sections for storing a plurality of signals within said range of frequencies and their corresponding digital quality level signals in response to said scanning means; and means for comparing said current digital level signal with a stored level signal representing the weakest signal level and for deleting the stored level signal representing the weakest signal level and it associated signal frequency stored in memory to produce a free memory location and, upon detection of a stronger current digital quality level signal by said means for comparing, storing said stronger digital quality level signal and its associated signal frequency in said free memory location.

10. The system of claim 9 wherein said quality is the intensity of said detected signal.

11. The system of claim 10 wherein said receiver means may receive and demodulate AM or FM radio broadcasts.

12. The system of claim 10 wherein said receiver means includes frequency synthesizer means for receiving said tuning signal.

13. A method of detecting radio waves in a receiver comprising:

receiving and demodulating radio waves at an input frequency in response to a tuning signal to produce an output;

detecting the quality of said output and developing a current digital quality level signal;

providing said tuning signal for receiving an input frequency within a desired range of frequencies;

storing a plurality of signals within said range of frequencies and their corresponding digital quality level signals in response to said step of providing;

comparing the current digital quality level signal with a stored digital quality level signal representing the weakest quality level; and substituting the current digital quality level signal and its associated signal frequency for the level signal representing the weakest digital quality level and the corresponding frequency when said current digital quality level signal exceeds the level of the level signal representing said weakest digital quality level.

* * * * *